United States Patent
Adams et al.

(10) Patent No.: US 11,971,665 B2
(45) Date of Patent: Apr. 30, 2024

(54) WAFER ALIGNMENT USING FORM BIREFRINGENCE OF TARGETS OR PRODUCT

(71) Applicant: ASML Holding N.V., Veldhoven (NL)

(72) Inventors: Joshua Adams, Wilton, CT (US); Yuxiang Lin, Wilton, CT (US); Krishanu Shome, Cheshire, CT (US); Gerrit Johannes Nijmeijer, Stamford, CT (US); Igor Matheus Petronella Aarts, Port Chester, NY (US)

(73) Assignee: ASML Holding N.V., Veldhoven (NL)

( * ) Notice: Subject to any disclaimer, the term of this patent is extended or adjusted under 35 U.S.C. 154(b) by 293 days.

(21) Appl. No.: 17/432,019

(22) PCT Filed: Feb. 6, 2020

(86) PCT No.: PCT/EP2020/053044
§ 371 (c)(1),
(2) Date: Aug. 18, 2021

(87) PCT Pub. No.: WO2020/169357
PCT Pub. Date: Aug. 27, 2020

(65) Prior Publication Data
US 2022/0137523 A1    May 5, 2022

Related U.S. Application Data

(60) Provisional application No. 62/808,423, filed on Feb. 21, 2019.

(51) Int. Cl.
*G03F 9/00* (2006.01)
(52) U.S. Cl.
CPC .......... *G03F 9/7065* (2013.01); *G03F 9/7076* (2013.01); *G03F 9/7088* (2013.01)

(58) Field of Classification Search
CPC ..... G03F 9/7065; G03F 9/7076; G03F 9/7088
See application file for complete search history.

(56) References Cited

U.S. PATENT DOCUMENTS

| | | |
|---|---|---|
| 6,297,876 B1 | 10/2001 | Bornebroek |
| 6,961,116 B2 | 11/2005 | Den Boef et al. |

(Continued)

FOREIGN PATENT DOCUMENTS

| | | |
|---|---|---|
| CN | 101251718 A | 8/2008 |
| CN | 102402141 A | 4/2012 |

(Continued)

OTHER PUBLICATIONS

International Search Report and Written Opinion of the International Searching Authority directed to related International Patent Application No. PCT/EP2020/053044, dated May 20, 2020; 9 pages.

(Continued)

*Primary Examiner* — Jaehwan Oh
(74) *Attorney, Agent, or Firm* — Sterne, Kessler, Goldstein & Fox P.L.L.C.

(57) ABSTRACT

An alignment method includes directing an illumination beam with a first polarization state to form a diffracted beam with a second polarization state from an alignment target, and passing the diffracted beam through a polarization analyzer. The alignment method further includes measuring a polarization state of the diffracted beam and determining a location of the alignment target from the measured polarization state relative to its initial polarization state. The alignment target includes a plurality of diffraction gratings with a single pitch and two or more duty cycles, wherein the pitch is smaller than a wavelength of the illumination beam, and the location of the alignment target corresponds to the duty cycle of the diffraction grating.

16 Claims, 11 Drawing Sheets

(56) References Cited

U.S. PATENT DOCUMENTS

| | | | |
|---|---|---|---|
| 7,460,231 B2 * | 12/2008 | Musa | G03F 9/7015 |
| | | | 356/521 |
| 7,511,799 B2 | 3/2009 | Tel et al. | |
| 7,701,577 B2 | 4/2010 | Straaijer et al. | |
| 7,863,763 B2 * | 1/2011 | Van Haren | G03F 9/7088 |
| | | | 356/485 |
| 8,319,940 B2 * | 11/2012 | Butler | G03F 9/7015 |
| | | | 355/75 |
| 8,610,898 B2 | 12/2013 | Khuat Duy | |
| 8,706,442 B2 | 4/2014 | Mos et al. | |
| 9,030,661 B1 * | 5/2015 | Mieher | G03F 9/7088 |
| | | | 356/400 |
| 9,395,635 B2 * | 7/2016 | De Boer | G03F 9/7076 |
| 10,082,740 B2 * | 9/2018 | Chen | G03F 7/70575 |
| 10,133,188 B2 | 11/2018 | Jak et al. | |
| 10,488,767 B2 | 11/2019 | Shome et al. | |
| 2002/0093656 A1 | 7/2002 | Takeuchi et al. | |
| 2004/0130690 A1 * | 7/2004 | Koren | G03F 9/7046 |
| | | | 355/71 |
| 2006/0098189 A1 | 5/2006 | Oomori et al. | |
| 2007/0114678 A1 * | 5/2007 | Van Haren | G03F 9/7049 |
| | | | 257/797 |
| 2009/0153825 A1 * | 6/2009 | Edart | G03F 9/7088 |
| | | | 355/77 |
| 2009/0195768 A1 | 8/2009 | Bijnen et al. | |
| 2011/0085726 A1 * | 4/2011 | Den Boef | G03F 9/7065 |
| | | | 382/151 |
| 2011/0134419 A1 * | 6/2011 | Fuchs | G01N 21/956 |
| | | | 356/237.5 |
| 2012/0062863 A1 * | 3/2012 | Bijnen | G03F 9/7088 |
| | | | 356/369 |
| 2012/0133938 A1 * | 5/2012 | Deckers | G03F 1/44 |
| | | | 356/388 |
| 2012/0212749 A1 * | 8/2012 | Den Boef | G03F 9/7088 |
| | | | 356/615 |
| 2015/0116721 A1 | 4/2015 | Kats et al. | |
| 2016/0223920 A1 * | 8/2016 | Tinnemans | G01B 9/02015 |
| 2020/0409277 A1 * | 12/2020 | Komaki | G03F 9/7065 |

FOREIGN PATENT DOCUMENTS

| | | |
|---|---|---|
| CN | 108604065 A | 9/2018 |
| CN | 109313402 A | 2/2019 |
| EP | 1 628 164 A2 | 2/2006 |
| EP | 1 788 451 A1 | 5/2007 |
| WO | WO 2018/215173 A1 | 11/2018 |

OTHER PUBLICATIONS

International Preliminary Report on Patentability directed to related International Patent Application No. PCT/EP2020/053044, dated Aug. 10, 2021; 7 pages.

Niu et al., "Specular Spectroscopic Scatterometry in DUV Lithography," Proc. of SPIE, vol. 3677, Metrology, Inspection, and Process Control for Microlithography XIII, Jun. 14, 1999; 10 pages.

Raymond et al., "Multiparameter grating metrology using optical scatterometry," Journal of Vacuum Science & Technology B: Microelectronics and Nanometer Structures Processing, Measurement, and Phenomena, vol. 15, No. 2, Mar. 1997; pp. 361-368.

Chinese Office Action directed to Chinese Patent Application No. 202080015884.1, mailed Nov. 30, 2023; 16 pages.

* cited by examiner

WAFER ALIGNMENT USING FORM BIREFRINGENCE OF TARGETS OR PRODUCT

CROSS-REFERENCE TO RELATED APPLICATIONS

This application claims priority of U.S. Provisional Patent Application No. 62/808,423, which was filed on Feb. 21, 2019, and which is incorporated herein in its entirety by reference.

FIELD

The present disclosure relates to alignment apparatuses and systems, for example, alignment sensor apparatuses for lithographic apparatuses and systems.

BACKGROUND

A lithographic apparatus is a machine that applies a desired pattern onto a substrate, usually onto a target portion of the substrate. A lithographic apparatus may be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

Another lithographic system is an interferometric lithographic system where there is no patterning device, but rather a light beam is split into two beams, and the two beams are caused to interfere at a target portion of the substrate through the use of a reflection system. The interference causes lines to be formed at the target portion of the substrate.

During lithographic operation, different processing steps may require different layers to be sequentially formed on the substrate. Accordingly, it may be necessary to position the substrate relative to prior patterns formed thereon with a high degree of accuracy. Generally, alignment marks are placed on the substrate to be aligned and are located with reference to a second object. A lithographic apparatus may use an alignment apparatus for detecting positions of the alignment marks and for aligning the substrate using the alignment marks to ensure accurate exposure from a mask. Misalignment between the alignment marks at two different layers is measured as overlay error.

In order to monitor the lithographic process, parameters of the patterned substrate are measured. Parameters may include, for example, the overlay error between successive layers formed in or on the patterned substrate and critical linewidth of developed photosensitive resist. This measurement may be performed on a product substrate and/or on a dedicated metrology target. There are various techniques for making measurements of the microscopic structures formed in lithographic processes, including the use of scanning electron microscopes and various specialized tools. A fast and non-invasive form of a specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Spectroscopic scatterometers direct a broadband radiation beam onto the substrate and measure the spectrum (intensity as a function of wavelength) of the radiation scattered into a particular narrow angular range. By contrast, angularly resolved scatterometers use a monochromatic radiation beam and measure the intensity of the scattered radiation as a function of angle.

Such optical scatterometers may be used to measure parameters, such as critical dimensions of developed photosensitive resist or overlay error (OV) between two layers formed in or on the patterned substrate. Properties of the substrate can be determined by comparing the properties of an illumination beam before and after the beam has been reflected or scattered by the substrate.

Fabrication tolerances continue to tighten as semiconductor devices become ever smaller and more elaborate. Hence, there is a need to continue to improve metrology measurements. One exemplary use of scatterometers is for critical dimension (CD) metrology, which is particularly useful for measuring in patterned structures, such as semiconductor wafers. Optical CD metrology techniques include on dome scatterometry, spectral reflectometry, and spectral ellipsometry. All these techniques are based on measuring the reflected intensity of differently polarized light for different incident directions. Such techniques require a high extinction ratio, or purity of polarization. A polarizing beamsplitter (PBS) divides light by polarization state to transmit p-polarized light while reflecting s-polarized light. Though a perfect PBS transmits 100% of the p-polarization and reflects 100% s-polarization, a real PBS transmits and reflects mixtures of s-polarized light and p-polarized light. The ratio between the p-polarized light and s-polarized light is called the extinction ratio. Optical CD requires a high extinction ratio.

Another exemplary use of scatterometers is for overlay (OV) metrology, which is useful for measuring alignment of a stack of layers on a wafer. In order to control the lithographic process to place device features accurately on the substrate, alignment marks, or targets, are generally provided on the substrate, and the lithographic apparatus includes one or more alignment apparatuses by which positions of marks on a substrate must be measured accurately. In one known technique, the scatterometer measures diffracted light from targets on the wafer.

In general, lithographic alignment and metrology are two distinct steps with individually dedicated tools. Alignment is the measurement of wafer lateral positions needed to accurately place the wafer under the lithography device, and metrology generally evaluates how well that operation was done after the next layer is printed. However, it is also possible to print targets with an offset slightly larger than the target diameter and to evaluate an offset overlay by the alignment tool of record. This offset overlay can be used for lithography machine validation, to validate a direct overlay metrology method by printing both offset and true overlay targets back-to-back, or even as the feedback correction to the scanner itself. In these ways, alignment tools can also be relevant to lithographic metrology.

Ideally, overlay error is solely a product of positioning of the substrate within the lithographic system. In practice, however, overlay error originates from the interaction between the alignment apparatus, the substrate, and the exact material types and geometries of patterns already printed under the layer of interest which is generally called the stack. Variations in the alignment apparatus and substrate can produce errors in assessing the true location of the alignment marks. Such errors are known as "on-process" accuracy errors. Alignment apparatus optics contain manufacturing aberrations and, thus, cannot be made identical. Further, diffraction based alignment apparatus optics cannot differentiate between phase offsets induced by asymmetry variations in an alignment target and phase differences among diffraction orders of the alignment target. Substrates (e.g., wafer stacks), likewise, have properties variations stemming from manufacturing and post-manufacturing processes. Asymmetry variations in an alignment target from processing can cause alignment errors as large as several nanometers and are difficult to predict or calibrate. This "on-process" accuracy problem limits the robustness of the alignment apparatus.

Accordingly, there is a need for a system and method to provide alignment relatively insensitive to process and structure variations of the alignment marks or targets.

SUMMARY

Embodiments of an alignment system and method are described in the present disclosure.

In some embodiments, a method includes directing an illumination beam with a first polarization state to form a diffracted beam with a second polarization state from an alignment target and splitting the diffracted beam into first and second polarization sub-beams. The method also includes measuring either partially or fully polarization state of the diffracted beam by making intensity measurements on the two sub-beams and determining a location of the alignment target from the measured polarization state.

In some embodiments, the alignment target includes a plurality of diffraction gratings with a single pitch, necessarily smaller than the wavelength of the illumination beam, and two or more duty cycles. The location of the alignment target corresponds to the duty cycle of the diffraction grating.

In some embodiments, the duty cycle of the gratings is monotonically changed across the target.

In some embodiments, the duty cycle of the grating is made to exhibit a single local minimum or maximum across the target.

In some embodiments, the duty cycle of the grating is varied in a more complicated and potentially periodic way across the target.

In some embodiments, the diffraction gratings include a rectangular shape.

In some embodiments, the diffraction gratings include asymmetric shapes with a top-tilt, a bottom tilt or a sidewall angle.

In some embodiments, the diffraction gratings include a sinusoidal shape.

In some embodiments, the illumination beam is linearly polarized and an electric field of the illumination beam forms an angle between 0 degree and 90 degree with respect to grating lines.

In some embodiments, the illumination beam is circularly or elliptically polarized.

In some embodiments, the illumination beam is incident normally with respect to the alignment target.

Another aspect of the present disclosure provides an alignment system. The alignment system includes first and second optical systems. The first optical system is configured to direct an illumination beam with a first polarization state towards an alignment target and direct a diffracted beam with a second polarization state from the alignment target to the second optical system. The second optical system is configured to split the diffracted beam into first and second polarization sub-beams. The alignment system further includes first and second detectors configured to measure a polarization state projected through the two orthogonal axes of the polarization analyzer from the first and second polarization sub-beams and a processor configured to determine a location of the alignment target from the measured polarization state.

In some embodiments, the first and second optical systems are monolithically integrated with the alignment target on a substrate.

In some embodiments, the substrate includes silicon.

In some embodiments, the first and second optical systems include silicon photonics.

In some embodiments, the wafer and alignment sensor may be scanned relative to each other by a motion control system during measurement and a single resolution element detector may be used.

In some embodiments, the wafer and alignment sensor may be fixed relative to each other during measurement and the detector will require multiple resolution elements placed at an image conjugate to the wafer.

In some embodiments, the first and second detectors are monolithically integrated on the substrate.

In some embodiments, fiber optics can be used as optical links for the first and second optical systems.

In some embodiments, the alignment target includes a plurality of diffraction gratings with a single pitch and two or more duty cycles, the pitch being smaller than a wavelength of the illumination beam.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1A:
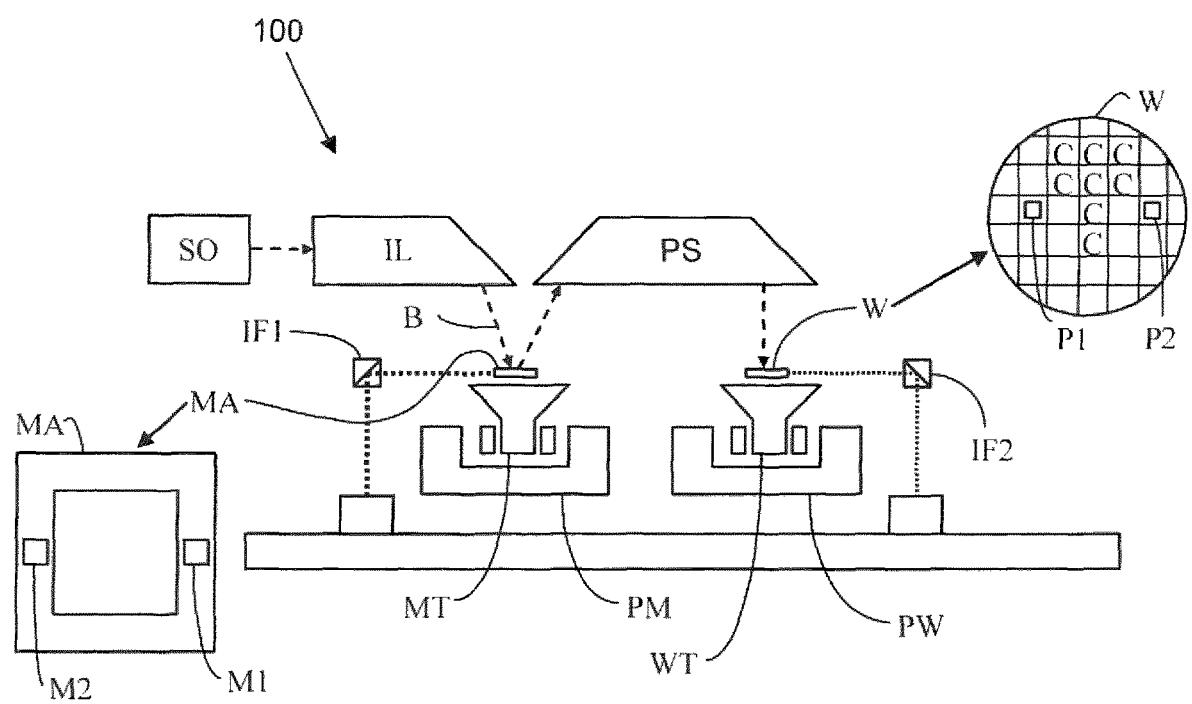
FIG. 1A is a schematic illustration of a reflective lithographic apparatus, according to an exemplary embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure may be implemented.

Example Lithographic Systems

Figure 1B:
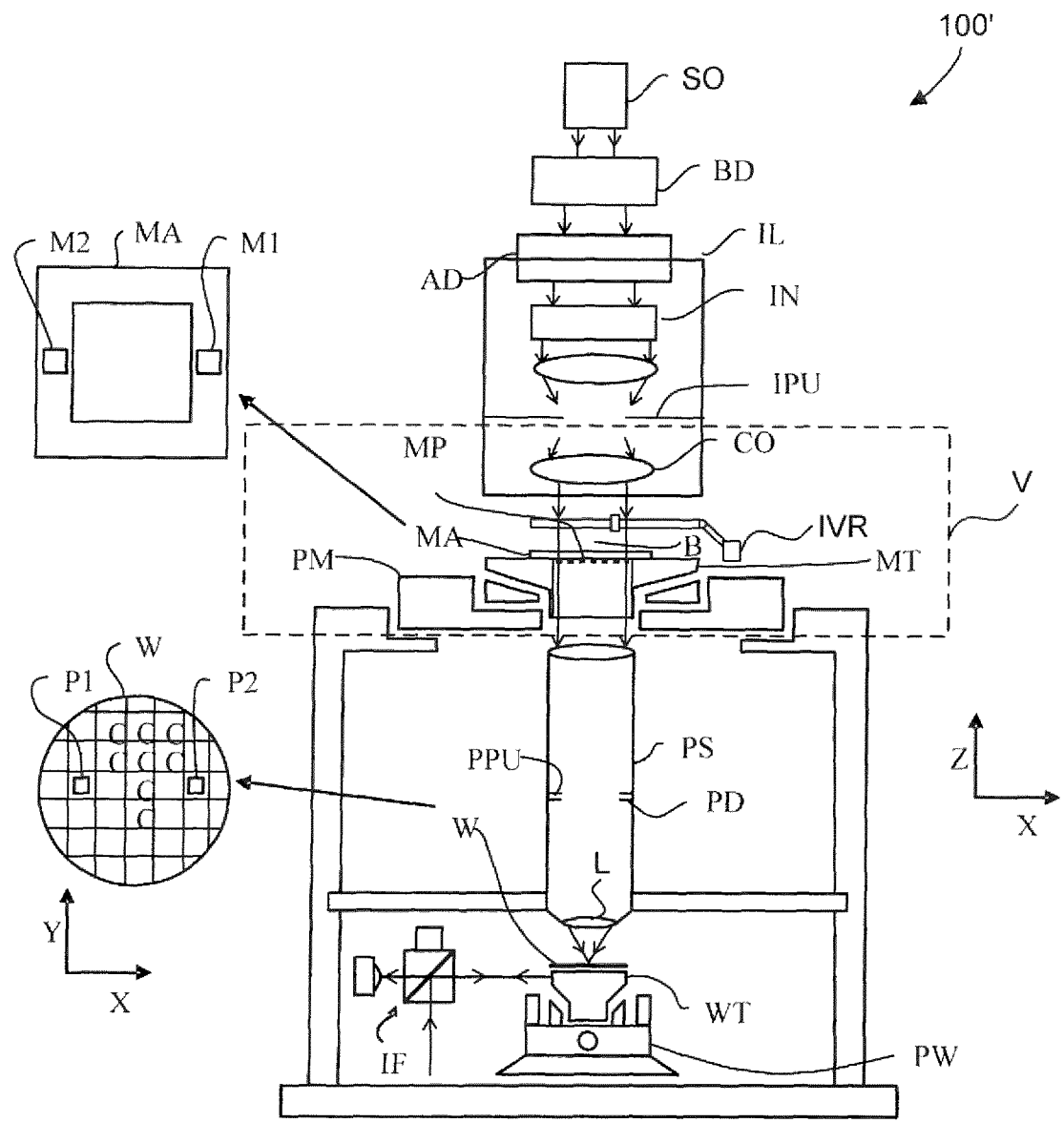
FIG. 1B is a schematic illustration of a transmissive lithographic apparatus, according to an exemplary embodiment.

FIGS. 1A and 1B are schematic illustrations of a lithographic apparatus 100 and lithographic apparatus 100', respectively, in which embodiments of the present invention may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100', for example, when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration may be reduced by providing radiation poles (not shown) in opposite quadrants of the illumination system pupil IPU. Further, in some embodiments, astigmatism aberration may be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber V, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
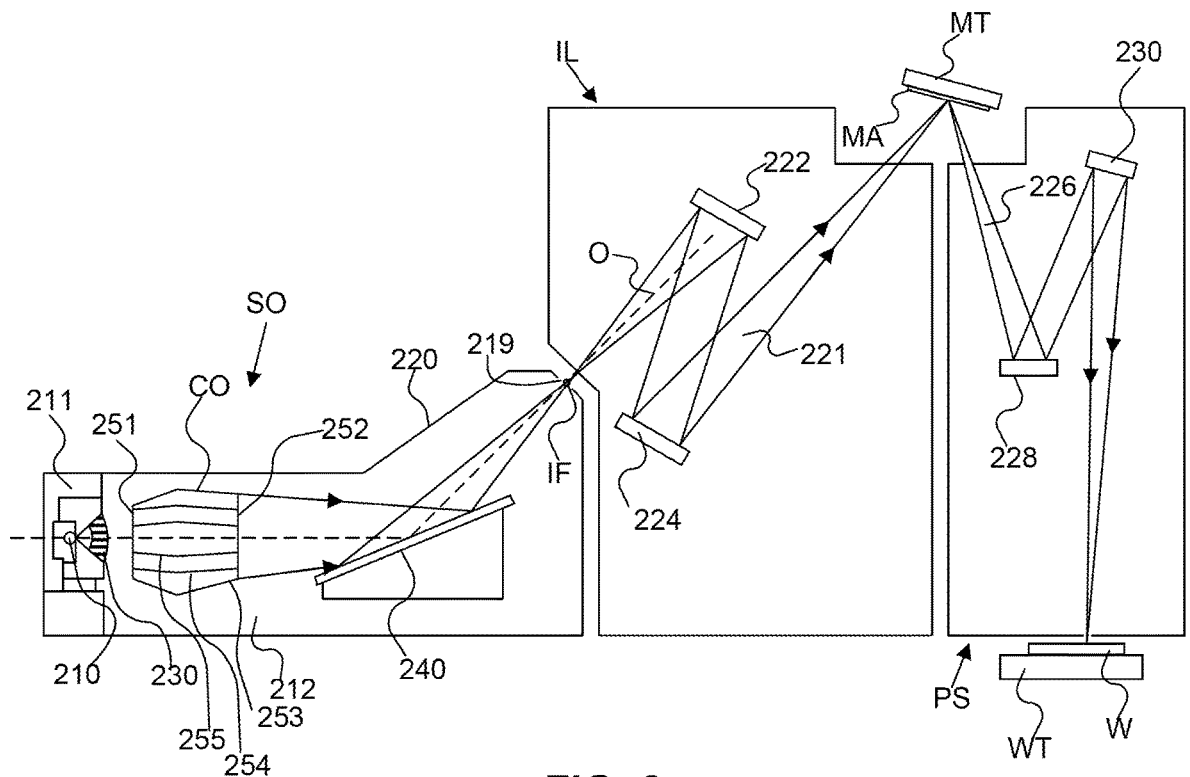
FIG. 2 is a more detailed schematic illustration of the reflective lithographic apparatus, according to an exemplary embodiment.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO, which can be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIG. 2, for example there may be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
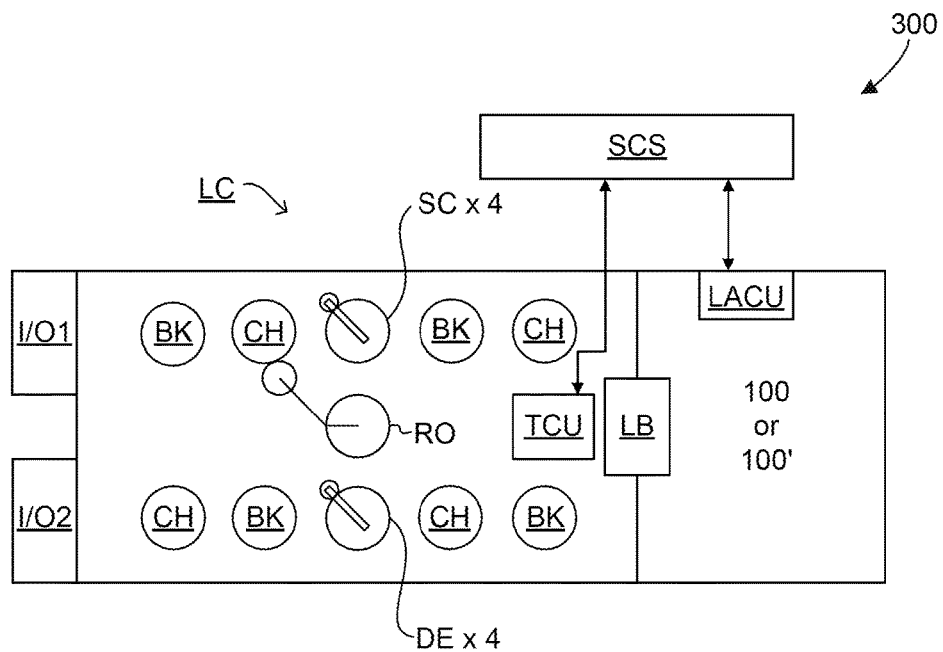
FIG. 3 is a schematic illustration of a lithographic cell, according to an exemplary embodiment.

FIG. 3 shows a lithographic cell 300, also sometimes referred to a lithocell or cluster. Lithographic apparatus 100 or 100' may form part of lithographic cell 300. Lithographic cell 300 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Exemplary Alignment Apparatus Using Interference

In order to control the lithographic process to place device features accurately on the substrate, alignment "marks" or "targets" are generally provided on the substrate, and the lithographic apparatus includes one or more alignment apparatuses and/or systems by which positions of marks on a substrate must be measured accurately. These alignment apparatuses are effectively position measuring apparatuses. Different types of marks and different types of alignment apparatuses and/or systems are known from different times and different manufacturers. A type of system widely used in current lithographic apparatus is based on a self-referencing interferometer as described in U.S. Pat. No. 6,961,116 (den Boef et al.). Generally marks are measured separately to obtain X- and Y-positions. A combined X- and Y-measurement can be performed using the techniques described in U.S. Publication No. 2009/195768 A (Bijnen et al.), however. The full contents of both of these disclosures are incorporated herein by reference.

Figure 4A:
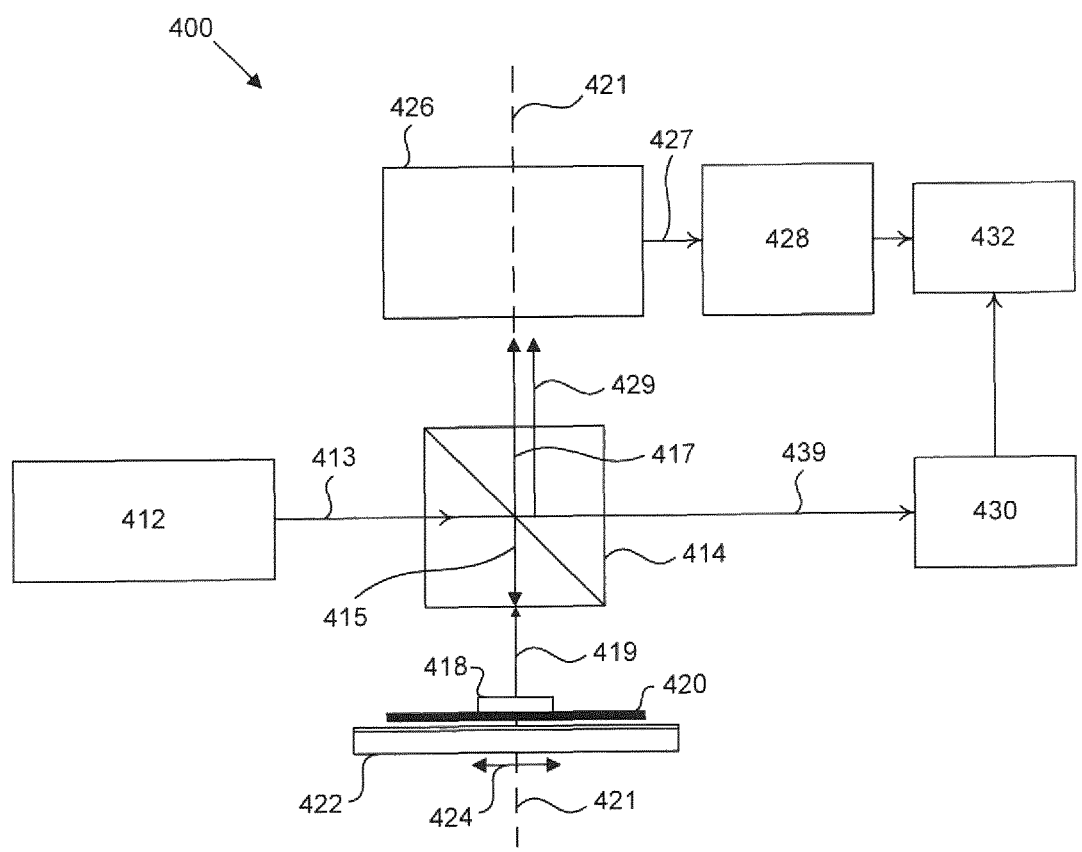
FIGS. 4A and 4B are schematic illustrations of enhanced alignment apparatuses, according to various exemplary embodiments.

FIG. 4A illustrates a schematic of a cross-sectional view of an alignment apparatus 400 that can be implemented as a part of lithographic apparatus 100 or 100', according to an embodiment. In an example of this embodiment, alignment apparatus 400 may be configured to align a substrate (e.g., substrate W) with respect to a patterning device (e.g., patterning device MA). Alignment apparatus 400 may be further configured to detect positions of alignment marks on the substrate and to align the substrate with respect to the patterning device or other components of lithographic apparatus 100 or 100' using the detected positions of the alignment marks. Such alignment of the substrate may ensure accurate exposure of one or more patterns on the substrate.

According to an embodiment, alignment apparatus 400 may include an illumination system 412, a beam splitter 414, an interferometer 426, a detector 428, a beam analyzer 430, and an overlay calculation processor 432, according to an example of this embodiment. Illumination system 412 may be configured to provide an electromagnetic narrow band radiation beam 413 having one or more passbands. In an example, the one or more passbands may be within a spectrum of wavelengths between about 500 nm to about 900 nm. In another example, the one or more passbands may be discrete narrow passbands within a spectrum of wavelengths between about 500 nm to about 900 nm. Illumination system 412 may be further configured to provide one or more passbands having substantially constant center wavelength (CWL) values over a long period of time (e.g., over a lifetime of illumination system 412). Such configuration of illumination system 412 may help to prevent the shift of the actual CWL values from the desired CWL values, as discussed above, in current alignment systems. And, as a result, the use of constant CWL values may improve long-term stability and accuracy of alignment systems (e.g., alignment apparatus 400) compared to the current alignment apparatuses.

Beam splitter 414 may be configured to receive radiation beam 413 and split radiation beam 413 into at least two radiation sub-beams, according an embodiment. In an example, radiation beam 413 may be split into radiation sub-beams 415 and 417, as shown in FIG. 4A. Beam splitter 414 may be further configured to direct radiation sub-beam 415 onto a substrate 420 placed on a stage 422. In one example, the stage 422 is movable along direction 424. Radiation sub-beam 415 may be configured to illuminate an alignment mark or a target 418 located on substrate 420. Alignment mark or target 418 may be coated with a radiation sensitive film in an example of this embodiment. In another example, alignment mark or target 418 may have one hundred and eighty degrees (i.e., 180°) symmetry. That is, when alignment mark or target 418 is rotated 180° about an axis of symmetry perpendicular to a plane of alignment mark or target 418, rotated alignment mark or target 418 may be substantially identical to an unrotated alignment mark or target 418. The target 418 on substrate 420 may be (a) a resist layer grating comprising bars that are formed of solid resist lines, or (b) a product layer grating, or (c) a composite grating stack in an overlay target structure comprising a resist grating overlaid or interleaved on a product layer grating. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. One in-line method used in device manufacturing for measurements of line width, pitch, and critical dimension makes use of a technique known as "scatterometry". Methods of scatterometry are described in Raymond et al., "Multiparameter Grating Metrology Using Optical Scatterometry", J. Vac. Sci. Tech. B, Vol. 15, no. 2, pp. 361-368 (1997) and Niu et al., "Specular Spectroscopic Scatterometry in DUV Lithography", SPIE, Vol. 3677 (1999), which are both incorporated by reference herein in their entireties. In scatterometry, light is reflected by periodic structures in the target, and the resulting reflection spectrum at a given angle is detected. The structure giving rise to the reflection spectrum is reconstructed, e.g. using Rigorous Coupled-Wave Analysis (RCWA) or by comparison to a library of patterns derived by simulation. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

Beam splitter 414 may be further configured to receive diffraction radiation beam 419 and split diffraction radiation beam 419 into at least two radiation sub-beams, according to an embodiment. In an example, diffraction radiation beam 419 may be split into diffraction radiation sub-beams 429 and 439, as shown in FIG. 4A.

It should be noted that even though beam splitter 414 is shown to direct radiation sub-beam 415 towards alignment mark or target 418 and to direct diffracted radiation sub-beam 429 towards interferometer 426, the disclosure is not so limiting. It would be apparent to a person skilled in the relevant art that other optical arrangements may be used to obtain the similar result of illuminating alignment mark or target 418 on substrate 420 and detecting an image of alignment mark or target 418.

As illustrated in FIG. 4A, interferometer 426 may be configured to receive radiation sub-beam 417 and diffracted radiation sub-beam 429 through beam splitter 414. In an example embodiment, diffracted radiation sub-beam 429 may be at least a portion of radiation sub-beam 415 that may be reflected from alignment mark or target 418. In an example of this embodiment, interferometer 426 comprises any appropriate set of optical-elements, for example, a combination of prisms that may be configured to form two images of alignment mark or target 418 based on the received diffracted radiation sub-beam 429. It should be appreciated that a good quality image need not be formed, but that the features of alignment mark 418 should be resolved. Interferometer 426 may be further configured to rotate one of the two images with respect to the other of the two images 180° and recombine the rotated and unrotated images interferometrically.

In an embodiment, detector 428 may be configured to receive the recombined image via interferometer signal 427 and detect interference as a result of the recombined image when alignment axis 421 of alignment apparatus 400 passes through a center of symmetry (not shown) of alignment mark or target 418. Such interference may be due to alignment mark or target 418 being 180° symmetrical, and the recombined image interfering constructively or destructively, according to an example embodiment. Based on the detected interference, detector 428 may be further configured to determine a position of the center of symmetry of alignment mark or target 418 and consequently, detect a position of substrate 420. According to an example, alignment axis 421 may be aligned with an optical beam perpendicular to substrate 420 and passing through a center of image rotation interferometer 426. Detector 428 may be further configured to estimate the positions of alignment mark or target 418 by implementing sensor characteristics and interacting with wafer mark process variations.

In a further embodiment, detector 428 determines the position of the center of symmetry of alignment mark or target 418 by performing one or more of the following measurements:
1. measuring position variations for various wavelengths (position shift between colors);
2. measuring position variations for various orders (position shift between diffraction orders); and
3. measuring position variations for various polarizations (position shift between polarizations).

This data can for example be obtained with any type of alignment sensor, for example a SMASH (SMart Alignment Sensor Hybrid) sensor, as described in U.S. Pat. No. 6,961,116 that employs a self-referencing interferometer with a single detector and four different wavelengths, and extracts the alignment signal in software, or ATHENA (Advanced Technology using High order ENhancement of Alignment), as described in U.S. Pat. No. 6,297,876, which directs each of seven diffraction orders to a dedicated detector, which are both incorporated by reference herein in their entireties.

In an embodiment, beam analyzer 430 may be configured to receive and determine an optical state of diffracted radiation sub-beam 439. The optical state may be a measure of beam wavelength, polarization, or beam profile. Beam analyzer 430 may be further configured to determine a position of stage 422 and correlate the position of stage 422 with the position of the center of symmetry of alignment mark or target 418. As such, the position of alignment mark or target 418 and, consequently, the position of substrate 420 may be accurately known with reference to stage 422. Alternatively, beam analyzer 430 may be configured to determine a position of alignment apparatus 400 or any other reference element such that the center of symmetry of alignment mark or target 418 may be known with reference to alignment apparatus 400 or any other reference element. Beam analyzer 430 can be a point or an imaging polarimeter with some form of wavelength-band selectivity. According to an embodiment, beam analyzer 430 may be directly integrated into alignment apparatus 400, or connected via fiber optics of several types: polarization preserving single mode, multimode, or imaging, according to other embodiments.

In an embodiment, beam analyzer 430 may be further configured to determine the overlay data between two patterns on substrate 420. One of these patterns may be a reference pattern on a reference layer. The other pattern may be an exposed pattern on an exposed layer. The reference layer may be an etched layer already present on substrate 420. The reference layer may be generated by a reference pattern exposed on the substrate by lithographic apparatus 100 and/or 100'. The exposed layer may be a resist layer exposed adjacent to the reference layer. The exposed layer may be generated by an exposure pattern exposed on substrate 420 by lithographic apparatus 100 or 100'. The exposed pattern on substrate 420 may correspond to a movement of substrate 420 by stage 422. In an embodiment, the measured overlay data may also indicate an offset between the reference pattern and the exposure pattern. The measured overlay data may be used as calibration data to calibrate the exposure pattern exposed by lithographic apparatus 100 or 100', such that after the calibration, the offset between the exposed layer and the reference layer may be minimized.

In an embodiment, beam analyzer 430 may be further configured to determine a model of the product stack profile of substrate 420, and may be configured to measure overlay, critical dimension, and focus of target 418 in a single measurement. The product stack profile contains information on the stacked product such as alignment mark, target 418, or substrate 420, and may include mark process variation-induced optical signature metrology that is a function of illumination variation. The product stack profile may also include product grating profile, mark stack profile, and mark asymmetry information. An example of beam analyzer 430 is Yieldstar™, manufactured by ASML, Veldhoven, The Netherlands, as described in U.S. Pat. No. 8,706,442, which is incorporated by reference herein in its entirety. Beam analyzer 430 may be further configured to process information related to a particular property of an exposed pattern in that layer. For example, beam analyzer 430 may process an overlay parameter (an indication of the positioning accuracy of the layer with respect to a previous layer on the substrate or the positioning accuracy of the first layer with respective to marks on the substrate), a focus parameter, and/or a critical dimension parameter (e.g., line width and its variations) of the depicted image in the layer. Other parameters are image parameters relating to the quality of the depicted image of the exposed pattern.

In some embodiments, an array of detectors (not shown) may be connected to beam analyzer 430, and allows the possibility of accurate stack profile detection as discussed below. For example, detector 428 can be an array of detectors. For the detector array, a number of options are possible: a bundle of multimode fibers, discrete pin detectors per channel, or CCD or CMOS (linear) arrays. The use of a bundle of multimode fibers enables any dissipating elements to be remotely located for stability reasons. Discrete PIN detectors offer a large dynamic range but each need separate pre-amps. The number of elements is therefore limited. CCD linear arrays offer many elements that can be read-out at high speed and are especially of interest if phase-stepping detection is used.

Figure 4B:
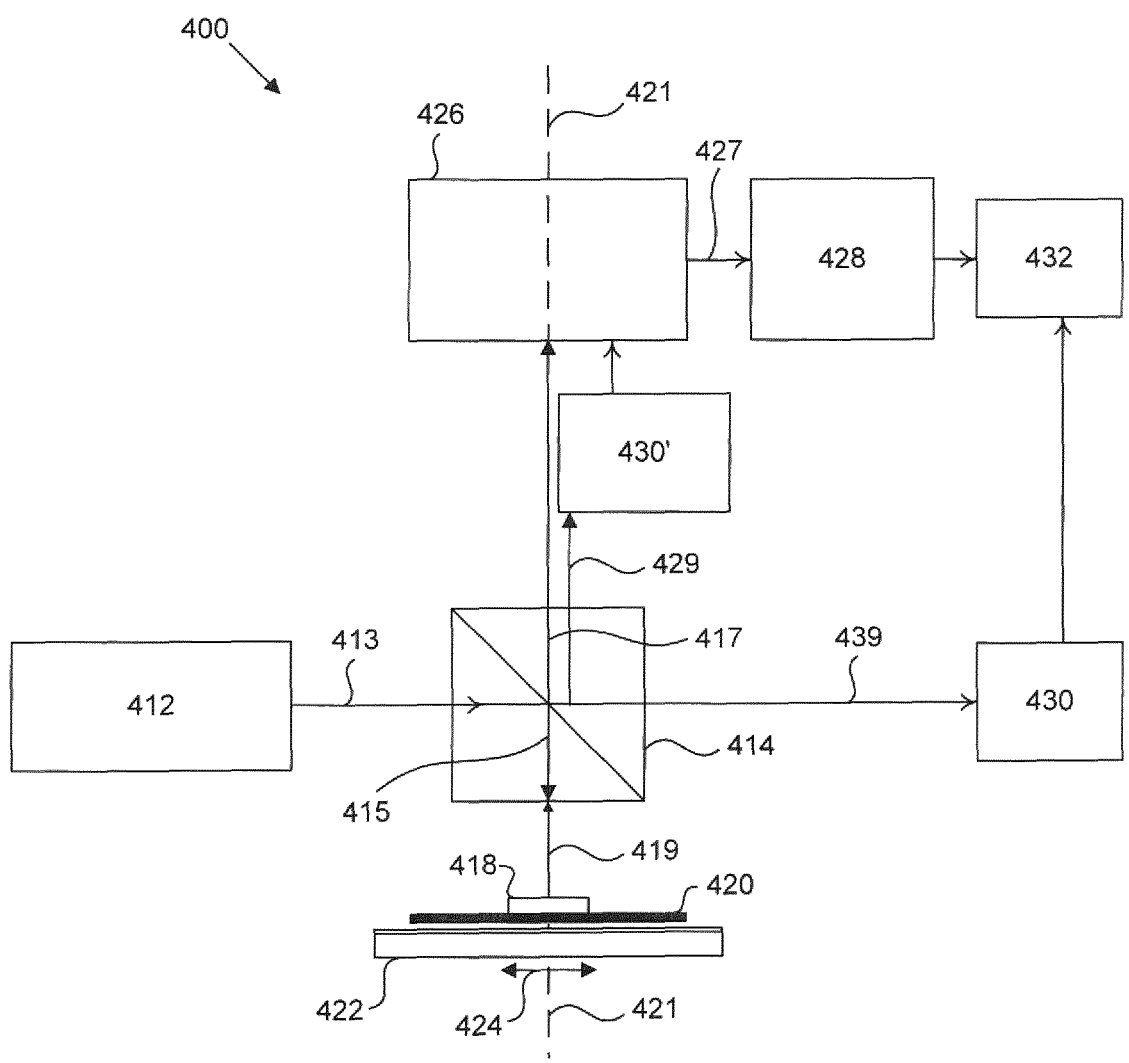

In an embodiment, a second beam analyzer 430' may be configured to receive and determine an optical state of diffracted radiation sub-beam 429, as shown in FIG. 4B. The optical state may be a measure of beam wavelength, polarization, or beam profile. Second beam analyzer 430' may be identical to beam analyzer 430. Alternatively, second beam analyzer 430' may be configured to perform at least all the functions of beam analyzer 430, such as determining a position of stage 422 and correlating the position of stage 422 with the position of the center of symmetry of alignment mark or target 418. As such, the position of alignment mark or target 418 and, consequently, the position of substrate 420, may be accurately known with reference to stage 422. Second beam analyzer 430' may also be configured to determine a position of alignment apparatus 400, or any other reference element, such that the center of symmetry of alignment mark or target 418 may be known with reference to alignment apparatus 400, or any other reference element. Second beam analyzer 430' may be further configured to determine the overlay data between two patterns and a model of the product stack profile of substrate 420. Second beam analyzer 430' may also be configured to measure overlay, critical dimension, and focus of target 418 in a single measurement.

In an embodiment, second beam analyzer 430' may be directly integrated into alignment apparatus 400, or it can be connected via fiber optics of several types: polarization preserving single mode, multimode, or imaging, according to other embodiments. Alternatively, second beam analyzer 430' and beam analyzer 430 may be combined to form a single analyzer (not shown) configured to receive and determine the optical states of both diffracted radiation sub-beams 429 and 439.

In an embodiment, processor 432 receives information from detector 428 and beam analyzer 430. For example, processor 432 may be an overlay calculation processor. The information may comprise a model of the product stack profile constructed by beam analyzer 430. Alternatively, processor 432 may construct a model of the product mark profile using the received information about the product mark. In either case, processor 432 constructs a model of the stacked product and overlay mark profile using or incorporating a model of the product mark profile. The stack model is then used to determine the overlay offset and minimizes the spectral effect on the overlay offset measurement. Processor 432 may create a basic correction algorithm based on the information received from detector 428 and beam analyzer 430, including but not limited to the optical state of the illumination beam, the alignment signals, associated position estimates, and the optical state in the pupil, image, and additional planes. The pupil plane is the plane in which the radial position of radiation defines the angle of incidence and the angular position defines the azimuth angle of the radiation. Processor 432 may utilize the basic correction algorithm to characterize the alignment apparatus 400 with reference to wafer marks and/or alignment marks 418.

In an embodiment, processor 432 may be further configured to determine printed pattern position offset error with respect to the sensor estimate for each mark based on the information received from detector 428 and beam analyzer 430. The information includes but is not limited to the product stack profile, measurements of overlay, critical dimension, and focus of each alignment marks or target 418 on substrate 420. Processor 432 may utilize a clustering algorithm to group the marks into sets of similar constant offset error, and create an alignment error offset correction table based on the information. The clustering algorithm may be based on overlay measurement, the position estimates, and additional optical stack process information associated with each set of offset errors. The overlay is calculated for a number of different marks, for example, overlay targets having a positive and a negative bias around a programmed overlay offset. The target that measures the smallest overlay is taken as reference (as it is measured with the best accuracy). From this measured small overlay, and the known programmed overlay of its corresponding target, the overlay error can be deduced. Table 1 illustrates how this may be performed. The smallest measured overlay in the example shown is −1 nm. However this is in relation to a target with a programmed overlay of −30 nm. Consequently the process must have introduced an overlay error of 29 nm.

TABLE 1

| Programmed overlay | −70 | −50 | −30 | −10 | 10 | 30 | 50 |
|---|---|---|---|---|---|---|---|
| Measured overlay | −38 | −19 | −1 | 21 | 43 | 66 | 90 |
| Difference between measured and programmed overlay | 32 | 31 | 29 | 31 | 33 | 36 | 40 |
| Overlay error | 3 | 2 | — | 2 | 4 | 7 | 11 |

The smallest value can be taken to be the reference point and, relative to this, the offset can be calculated between measured overlay and that expected due to the programmed overlay. This offset determines the overlay error for each mark or the sets of marks with similar offsets. Therefore, in the Table 1 example, the smallest measured overlay was −1 nm, at the target position with programmed overlay of 30 nm. The difference between the expected and measured overlay at the other targets is compared to this reference. A table such as Table 1 can also be obtained from marks and target 418 under different illumination settings, the illumination setting, which results in the smallest overlay error, and its corresponding calibration factor, may be determined and selected. Following this, processor 432 may group marks into sets of similar overlay error. The criteria for grouping marks may be adjusted based on different process controls, for example, different error tolerances for different processes.

In an embodiment, processor 432 may confirm that all or most members of the group have similar offset errors, and apply an individual offset correction from the clustering algorithm to each mark, based on its additional optical stack metrology. Processor 432 may determine corrections for each mark and feed the corrections back to lithographic apparatus 100 or 100' for correcting errors in the overlay, for example, by feeding corrections into the alignment apparatus 400.

Exemplary Alignment System Using Form Birefringence

Even as lithography systems provide smaller and smaller patterning features at advanced technology nodes for integrated circuits, they also need to increase accurate alignment between different lithography levels receiving smaller and smaller alignment marks or targets. Alignment marks can usually be placed in a scribe lane, an area between chips or dies (product areas) that is subsequently thrown away at die dicing before packaging. For a given process monitoring area, smaller size also allows more alignment marks being distributed at various locations to improve alignment and/or overlay uniformity across the wafer. Alternatively, for a die with large area, smaller alignment marks can be placed inside a die to improve alignment across a product chip.

As described previously, diffraction gratings can be used as alignment marks. And the operation of alignment systems can be based on the phase shift between the two symmetric high order diffractions (for example, m=+1 and m=−1, m=+2 and m=−2) measured by an interferometer or image sensor.

Figure 5A:
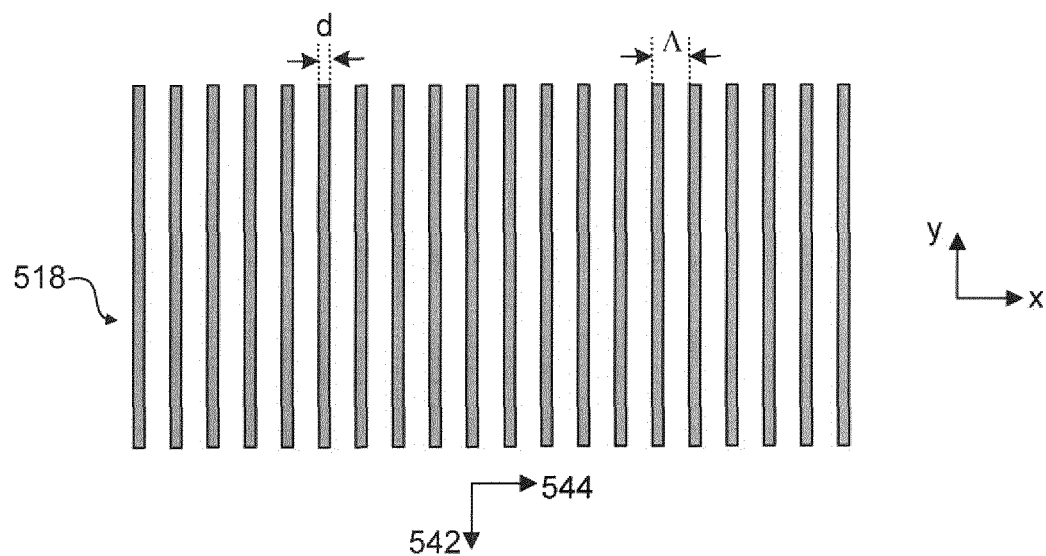
FIGS. 5A and 5B are top-down and cross-sectional views of a diffraction grating, according to some embodiments.
Figure 5B:
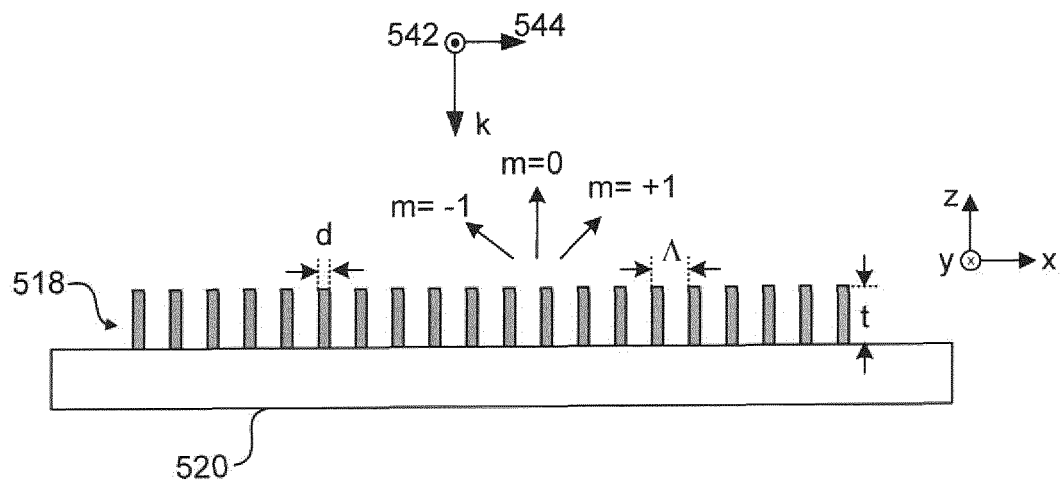

FIGS. 5A and 5B show respective top-down and cross-sectional views, according to an embodiment. For example, FIGS. 5A and 5B show top down and cross section views of a diffraction grating 518 that can include a single pitch or period of "Λ" and a grating line width of "d", formed on a substrate 520. The efficiency of high diffraction orders can be determined by parameters of diffraction grating 518, such as profile of the grating structure (e.g., rectangular shape in FIG. 5B), film stack thickness "t", duty cycle "F", etc. Duty cycle "F" can be defined as a ratio of grating width d and pitch Λ, i.e., F=d/Λ.

In one example, the spectral property (e.g., diffraction angles) of diffraction grating 518 can be described by a grating equation. For example, at normal incidence with a wavelength of λ or a wave vector of k=2π/λ, diffraction angle $\theta_m$ of mth order can be predicted by $$\Lambda \sin(\theta_m) = m\lambda \text{(normal incidence)} \quad (1)$$

Diffraction efficiency can be predicted using rigorous vector wave modeling or various other methods to solve Maxwell's equations which fully describe the electromagnetic fields as light propagates.

In one example, diffraction efficiency is low for the first order diffraction and decreases for higher orders. For example, the first order can be as low as 0.1% of the input power. In one example, although zeroth order diffraction consists of the majority light power, it may not carry alignment information in a system based on interference and is either blocked or filtered out as background noise. In one example, the need to fit several grating periods into a small sized target or the desire of semiconductor fabs to align on pitches that are representative of product size features requires using optical modules and objective lens with high numerical aperture (NA), preferably at least 0.9 and more preferably at least 0.95. Immersion system can provide NA over 1, but also comes with high cost, large size, and the complexity of managing fluids.

In one example, the interference-based alignment scheme is also sensitive to process variation induced alignment mark asymmetry. Due to the change in the structure of the gratings (e.g., sidewall and top tilt), the phase variation can be as large as the model-predicted phase shift and create alignment position error (APE). Details of alignment position error correction can be found in U.S. patent application 62/662,976 titled "Alignment Sensor Apparatus For Process Sensitivity Compensation", which is incorporated by reference herein in its entirety.

Birefringence can be observed in certain bulk material having anisotropic index of refraction that depends on polarization and propagation direction of light. Material with birefringence can be used for a waveplate, where two orthogonal polarization components of the light beam (e.g., transverse-electric (TE) polarization and transverse-magnetic (TM) polarization) experience a phase shift and the total polarization of the light beam can be altered at exit.

In some embodiments, diffraction grating 518 can have pitch Λ smaller than wavelength λ of incident light (so called a "sub-wavelength grating"), behaving as an artificial anisotropic material with form birefringence properties. When grating pitch Λ is much smaller than wavelength λ, due to geometric anisotropy of the grating structure two orthogonally polarized beams 542/544, one parallel to the grating grooves (e.g., TE-polarization 542) and the other perpendicular to the grating grooves (e.g., TM-polarization 544), encounter different effective refractive indexes and therefore acquire a phase difference. In one example, the magnitude of the form birefringence effect (e.g., the phase difference) depends on the grating structure (e.g., duty cycle F) and incident angle.

Furthermore, when grating pitch Λ is less than wavelength λ, only zeroth order of diffraction is allowed to propagate over any substantial distance. Zeroth order of diffraction from sub-wavelength grating 518 can be measured at a normal angle, perpendicular to substrate 520. By measuring the phase difference between the two orthogonally polarized beams 542/544, the physical parameters (e.g., duty cycle F) of sub-wavelength grating 518 can be extracted using rigorous coupled wave analysis (RCWA) modeling or other methods of solving Maxwell's equations.

Figure 6:
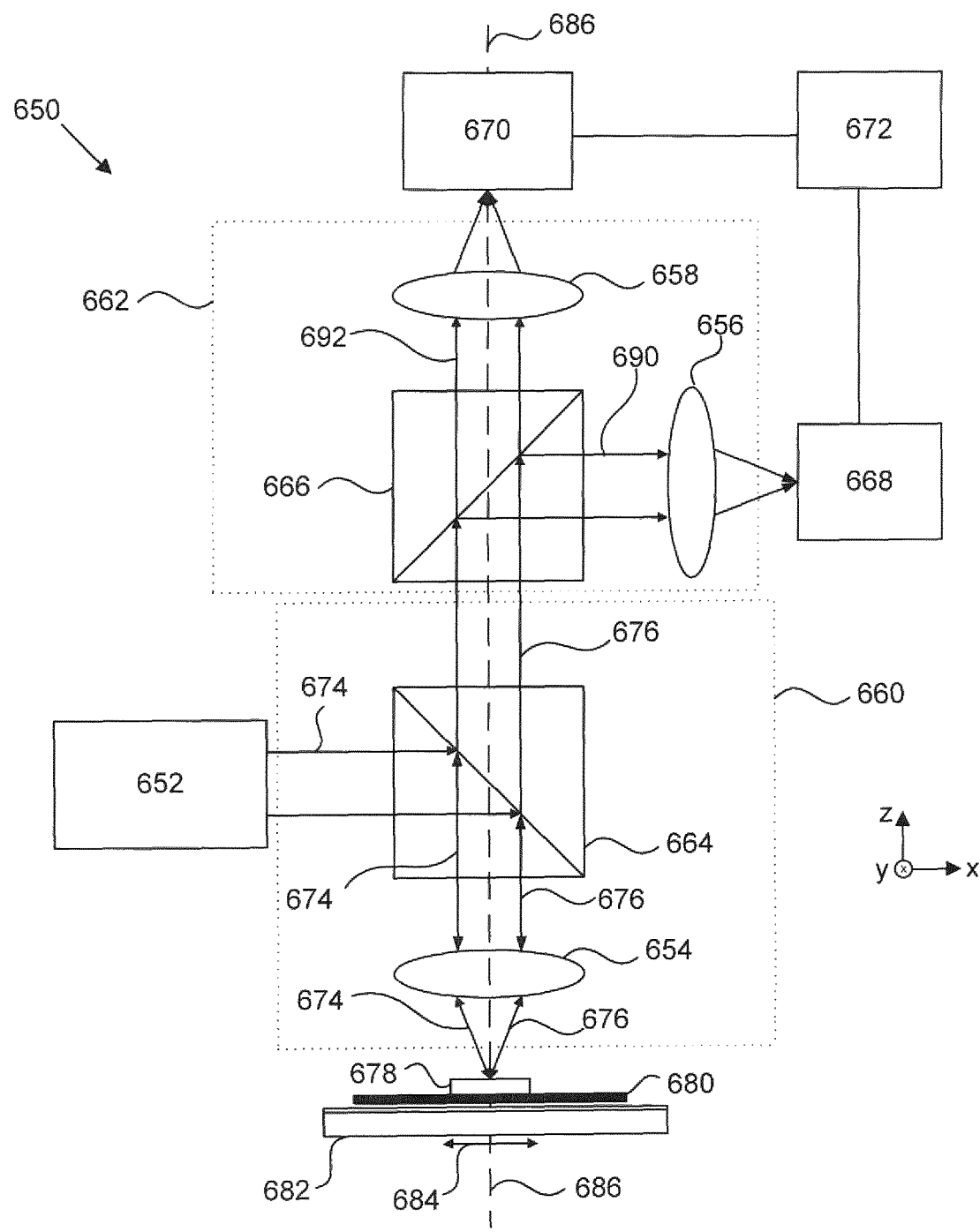
FIG. 6 is a schematic illustration of an alignment system using form birefringence of an alignment target, according to some embodiments.

FIG. 6 illustrates a schematic cross-sectional view of an alignment system 650, according to an exemplary embodiment. Alignment system 650 can be configured to measure location of alignment marks using the form birefringence property of the alignment marks. Alignment system 650 can be built as a part of lithographic apparatus 100 or 100', or can be built as a stand-alone unit in lithography cell or cluster 300 and work together with other apparatuses during operation.

In some embodiments, alignment system 650 may include an illumination system 652 and a first and a second optical systems 660/662. First optical system 660 includes an objective lens 654 and a beam splitter 664. Second optical system 662 includes objective lens 656 and 658 and a beam analyzer 666. Alignment system 650 also includes a first and second detector 668 and 670 and a processor 672.

In some embodiments, illumination system 652 is configured to transmit illumination beam 674 along an illumination path toward beam splitter 664. Illumination system 652 is similar to illumination system 412 described in FIGS. 4A and 4B.

Illumination system 652 may be configured to provide an electromagnetic narrow band illumination beam 674 having one or more passbands. In an example, the one or more passbands may be within a spectrum of wavelengths between about 500 nm to about 900 nm. In an example, the one or more passbands may be within a spectrum of wavelengths between about 10 nm to about 500 nm. In another example, the one or more passbands may be discrete narrow passbands within a spectrum of wavelengths between about 500 nm to about 900 nm. In another example, the one or more passbands may be discrete narrow passbands within a spectrum of wavelengths between about 10 nm to about 500 nm.

Illumination system 652 may be further configured to provide one or more passbands having substantially constant center wavelength (CWL) values over a long period of time (e.g., over a lifetime of illumination system 652). Such configuration of illumination system 652 may help to prevent the shift of the actual CWL values from the desired CWL values, as discussed above, in current alignment systems. And, as a result, the use of constant CWL values may improve long-term stability and accuracy of alignment systems (e.g., alignment system 650) compared to the current alignment apparatuses.

In some embodiments, illumination system 652 may use a broadband light source. For example, a light source with a wide range of light frequencies or wavelengths—and, thus, of colors. In another example, a radiation source that may give a large etendue (i.e., spread of light, e.g., the product of the area (A) of the source and the solid angle (Ω) that the system's entrance pupil subtends as seen from the source). This can allow for mixing of multiple wavelengths.

In some embodiments, illumination beam 674 may include a plurality of wavelengths in the broadband. For example, having a bandwidth of Δλ and a spacing of at least 2Δλ (i.e., twice the bandwidth).

In some embodiments, illumination system 652 may include several "sources" of radiation for different portions of an extended radiation source that have been split using fiber bundles. In this way, angle resolved scatter spectra can be measured at multiple wavelengths in parallel. For example, a 3-D spectrum (wavelength and two different angles) can be measured, which contains more information than a 2-D spectrum. This allows more information to be measured, which increases metrology process robustness. This is described in more detail in EP 1628164 A2, which is incorporated by reference herein in its entirety.

In some embodiments, illumination beam 674 can have a first polarization state, wherein the first polarization state includes linear polarization, circular polarization or elliptical polarization. Un-polarized irradiation from illumination system 652 can be changed to polarized beam by using a polarizer, such as dichroic, crystalline, or wire grid polarizers. Two orthogonal polarization directions of illumination beam 674 can be described as p-polarization (or H-polarization) and s-polarization (or V-polarization). For example, p-polarization has an electric field parallel to the plane of incidence and s-polarization has an electric field perpendicular to the plane of incidence.

In some embodiments, illumination beam 674 can have a polarization state that is adjustable with motors or electro-optical components to determine a full Mueller matrix or ellipsometry characterization of the target.

In some embodiments, first optical system 660 is configured to direct illumination beam 674 with the first polarization state towards an alignment mark or target 678 and direct a diffracted beam 676 with a second polarization state from alignment target 678 to second optical system 662.

In the example shown in FIG. 6, beam splitter 664 can be configured to receive illumination beam 674 and direct illumination beam 674 towards alignment target 678 of a substrate 680 placed on a stage 682 through objective lens 654. Beam splitter 664 can also be configured to receive diffracted beam 676 and direct diffracted beam 676 towards beam analyzer 666. In some embodiments, beam splitter 664 can be a spot mirror, formed by a transmissive cube with a reflective metal layer disposed in the center of the cube.

It should be noted that even though beam splitter 664 is shown to reflect illumination beam 674 towards alignment target 678 and to transmit diffracted beam 676 towards beam analyzer 666, the disclosure is not so limiting. It would be apparent to a person skilled in the relevant art that other optical arrangements may be used to obtain similar result.

In some embodiments, stage 682 can be movable along a scan direction 684 centered around an alignment axis 686. Illumination beam 674 can be directed on to a specific location of alignment target 678.

During the semiconductor manufacturing process, wafers can move beneath the primary lithography lens. How accurately the wafer is positioned under this exposure lens directly determines the quality of semiconductor products. Therefore, alignment marks are placed on the wafer starting from the first lithography level to ensure the precision of wafer position.

In some embodiments, alignment target 678 can be structures formed on substrate 680 through pattern transfer using a prior-level lithography mask (not shown in FIG. 6.) The material and film stack used for the formation of alignment target 678 can depend on the layout of alignment target 678 on the prior-level lithography mask and the processes that substrate 680 went through. In some embodiments, alignment target 678 can be made of or coated with a radiation sensitive film, for example, photoresist. The design requirement for alignment target 678 (e.g., shape and size) depends on the alignment system and alignment method used. In some embodiments, alignment target 678 can be a one-dimensional grating, with a typical duty cycle around 50%. In some embodiments, alignment target 678 can be a two-dimensional array or grating. In some embodiments, alignment target 678 can be a sub-wavelength grating having form birefringence phenomenon. In this disclosure, sub-wavelength gratings are designed for alignment target 678.

In some embodiments, objective lens 654 focuses illumination beam 674 onto alignment target 678 and collects diffracted beam 676 reflected from alignment target 678. It is known to a person skill in the art, other focusing optical systems can also be used to provide similar function.

In some embodiments, diffracted beam 676 from sub-wavelength gratings of alignment target 678 includes the zeroth order of diffraction. In this example, alignment system 650 can be set up with a normal incidence angle towards alignment target 678. With high intensity light from zeroth order of diffraction, requirement for the numerical aperture (NA) of objective lens 654 can be relaxed. A typical optical lens with NA of 0.1-0.3 can be sufficient to collect enough light for subsequent optical analysis.

In some embodiments, diffracted beam 676 includes the second polarization state that is different from the first polarization state of illumination beam 674. Due to form birefringence property of alignment target 678 with sub-wavelength gratings, TE- and TM-polarization components 542/544 of illumination beam 674 experience a phase difference, resulting in a change of overall polarization state in diffracted beam 676. While diffracted beam 676 can also include p-polarization (or H-polarization) and s-polarization (or V-polarization), due to the phase difference experienced at alignment target 678, intensity of p-polarization and s-polarization can be different from the respective ones of illumination beam 674. The magnitude of the phase difference that TE- and TM-polarization 542/544 experienced at alignment target 678 can correspond to the relative intensity change of p-polarization and s-polarization in diffraction beam 676 with respect to illumination beam 674 at incidence.

In some embodiments, second optical system 662 is configured to split diffracted beam 676 into first and second sub-beams 690/692. And beam analyzer 666 is configured to analyze various properties of diffracted beam 676, for example, intensity, beam shape, or polarization. In some embodiments, beam analyzer 666 can be a polarizing beam splitter, configured to separate diffracted beam 676 into first sub-beam 690 propagating in "x" direction and second sub-beam 692 propagating in "z" direction. Polarizing beam splitter 666 can be configured to reflect s-polarized beam and transmits p-polarized beam. In an exemplary configuration of FIG. 6, first sub-beam 690 can be s-polarized (or V-polarized) and second sub-beam 692 is p-polarized (or H-polarized).

In some embodiments, beam analyzer 666 can have a polarization state that is adjustable with motors or electro-optical components to determine a full Mueller matrix or ellipsometry characterization of the target.

In some embodiments, objective lens 656 and 658 can be configured to focus first sub-beam 690 and second sub-beam 692 onto first and second detectors 668 and 670, respectively. The first and second detectors 668/670 can be configured to measure light intensity of first sub-beam 690 and second sub-beam 692.

In one example, illumination beam 674 can be linearly p-polarized (also referred to as polarization in "H"-direction). In this example, light intensity of first sub-beam 690 with s-polarization measured at first detector 668 can be labeled as I(V,H). Similarly, light intensity of second sub-beam 692 with p-polarization measured at second detector 670 can be labeled as I(H,H).

In one example, processor 672 receives measured light intensity values from first and second detectors 668/670 and calculates a y-projected degree of polarization as a figure of merit to characterize the magnitude of form birefringence from alignment target 678. In one example, when illumination beam 674 is p-polarized (or H-polarized), the y-projected degree of polarization can be defined as yDOP, wherein $$yDOP = \frac{I(V, H) - I(H, H)}{I(V, H) + I(H, H)} \quad (2)$$

In equation (2), y-projected degree of polarization yDOP is chosen as a normalized function of I(V,H) and I(H,H), ranging between value −1 to +1.

When y-projected degree of polarization yDOP=−1, alignment target does not display form birefringence effect and there is no phase shift between TE-polarized and TM-polarized components 542/544.

When y-projected degree of polarization yDOP=+1, the phase difference between TE-polarized and TM-polarized components 542/544 is 180°, and H-polarized illumination beam 674 can be completely changed to diffracted beam with V-polarized first sub-beam 690 only.

In some embodiments, the y-projected degree of polarization yDOP can also be defined by some other formula or equation to track the relationship of I(V,H) and I(H,H), or in the other words, the phase difference between TE- and TM-polarized components 542/544 induced by the form birefringence of alignment target 678.

In some embodiments, illumination beam 674 can be linearly polarized in s-direction or "V-direction". Accordingly, the y-projected degree of polarization yDOP can be defined as $$yDOP = \frac{I(H, V) - I(V, V)}{I(H, V) + I(V, V)} \quad (3)$$

In some embodiments, illumination beam 674 can also be circularly or elliptically polarized. In this example, intensity of first and second sub-beams can be measured as a function of time, or measured as an average over a certain period of time.

Diffraction properties of alignment target 678 can be modeled by numerical simulation approach such as Rigorous Coupled-Wave Analysis (RCWA). Using RCWA, yDOP can be calculated as a function of physical parameters (e.g. duty cycle F) of the subwavelength grating of alignment target 678.

The measured yDOP from first and second sub-beams 690/692 can be compared with the calculated one to determine corresponding physical parameters (e.g., duty cycle F) of alignment target 678. When the location of a grating with the corresponding physical parameters is known on alignment target 678, precision alignment to the location can thereby be implemented.

In some embodiments, no numerical modeling is necessary to map y-projected degree of polarization onto grating coordinate, but rather a distinct feature in the yDOP signal, such as a threshold or a peak, can serve as the reference position.

In FIG. 6, alignment system 650 shows an example of design using free space optics. In some embodiments, first and second optical systems 660/662 can be monolithically integrated together on a photonics circuit and couple to the alignment target 678 on substrate 680.

In some embodiments, first and second detectors 668/670 can also be monolithically integrated to filters and beam shaping optics in an integrated photonics package in alignment system 650. For example, on a silicon substrate, first and second optical systems 660/662 can use optical elements of silicon photonics to achieve similar functions. Similarly, first and second detectors 668/670 can be germanium photodetectors integrated on the silicon substrate. In some embodiments, optical links between optical elements in alignment system 650 can also use fiber optics instead of propagating in free space, as shown in FIG. 6.

Figure 7A:
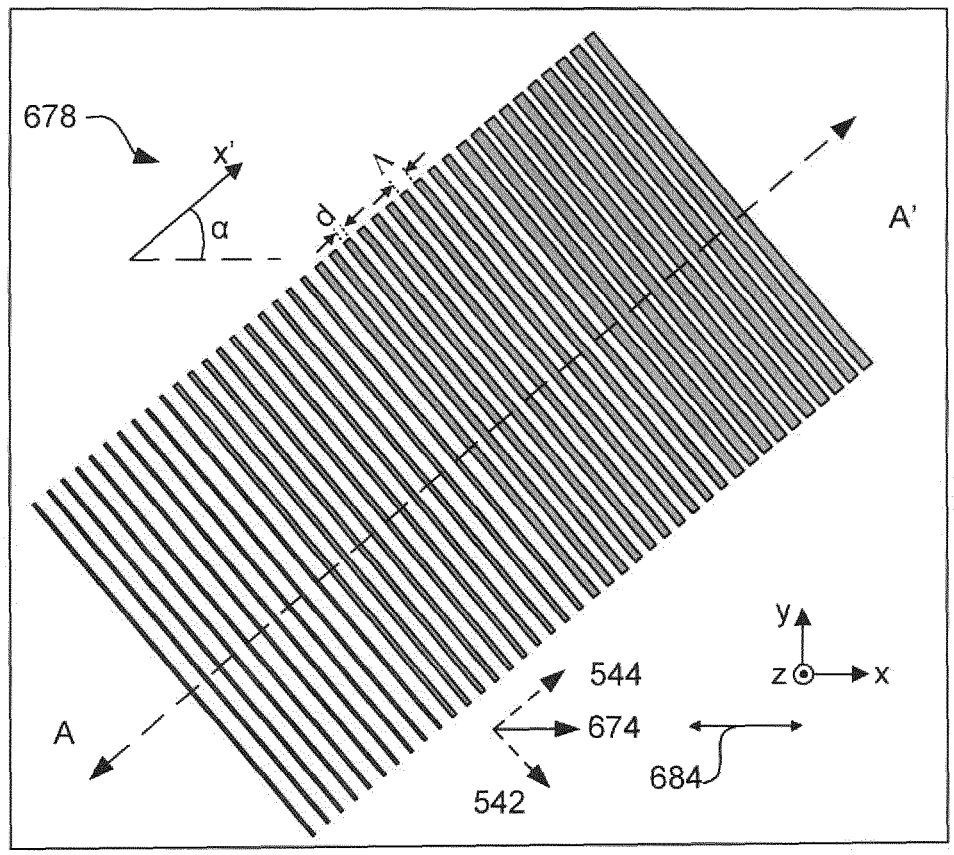
FIGS. 7A and 7B illustrate top-down and cross-sectional views of an alignment target with a single pitch and a plurality of duty cycles, according to some embodiments.

FIG. 7A illustrates a top-down view of an exemplary alignment target, according to an embodiment. For example, alignment target 678 can be designed for implementation with alignment system 650, accordingly to some embodiments.

Figure 7B:
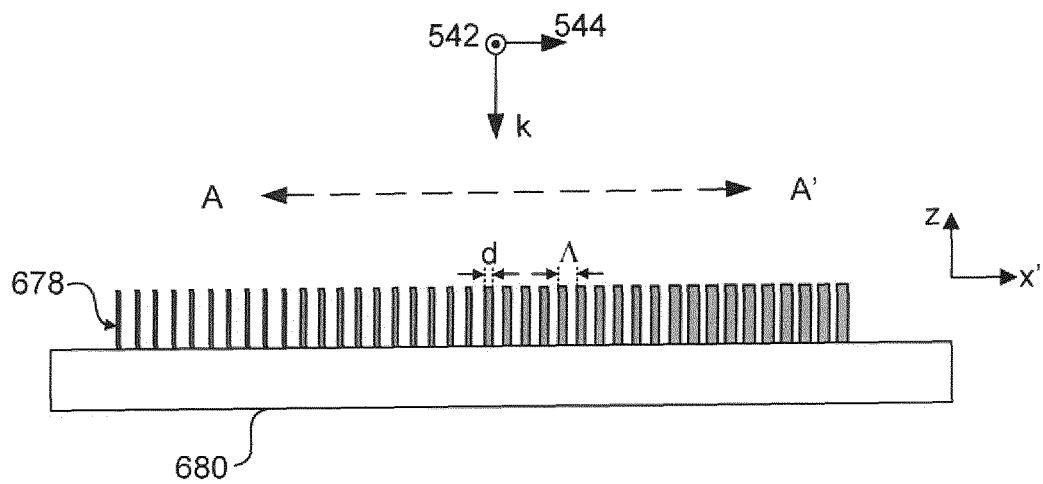

FIG. 7B illustrates a cross-sectional view of an exemplary alignment target, according to an embodiment. For example, cross-section of alignment target 678 in FIG. 7A is shown along AA' direction. In this example, alignment target 678 includes a plurality of diffraction gratings with a single pitch "A" and two or more duty cycles F, wherein duty cycle F=d/A. For a given pitch Λ, increasing line width "d" of the grating increases duty cycle F. As an example shown in FIG. 7A, alignment target 678 includes a plurality of gratings with increasing duty cycle along direction x', wherein direction x' forms an angle α with scan direction 684 of alignment system 650. Angle α can be any value between 0° to 90°. For the convenience of illustration, angle α is set to be 45° in this disclosure. The dimension of the diffraction grating with the same duty cycle determines the resolution of the alignment, and can be limited to less than the spot size of illumination beam 674.

In some embodiments, incident light (e.g., illumination beam 674) can be linearly polarized along x-direction (e.g., p-polarized). Polarization direction can be decomposed to two orthogonal polarization components, perpendicular or parallel to the direction of grating lines. For example, FIG. 7A illustrates the polarization direction of p-polarized illumination beam 674 with two orthogonal polarization components of TM- and TE-polarization 544/542. When pitch Λ of grating 678 is smaller than wavelength λ of the illumination beam, TE- and TM-polarization components 542/544 experience different phase change due to form birefringence effect, resulting in a rotation of total polarization direction of diffracted beam 676. The magnitude of the change of total polarization can be analyzed by measuring the light intensity of first and second sub-beams 690/692.

Figure 8:
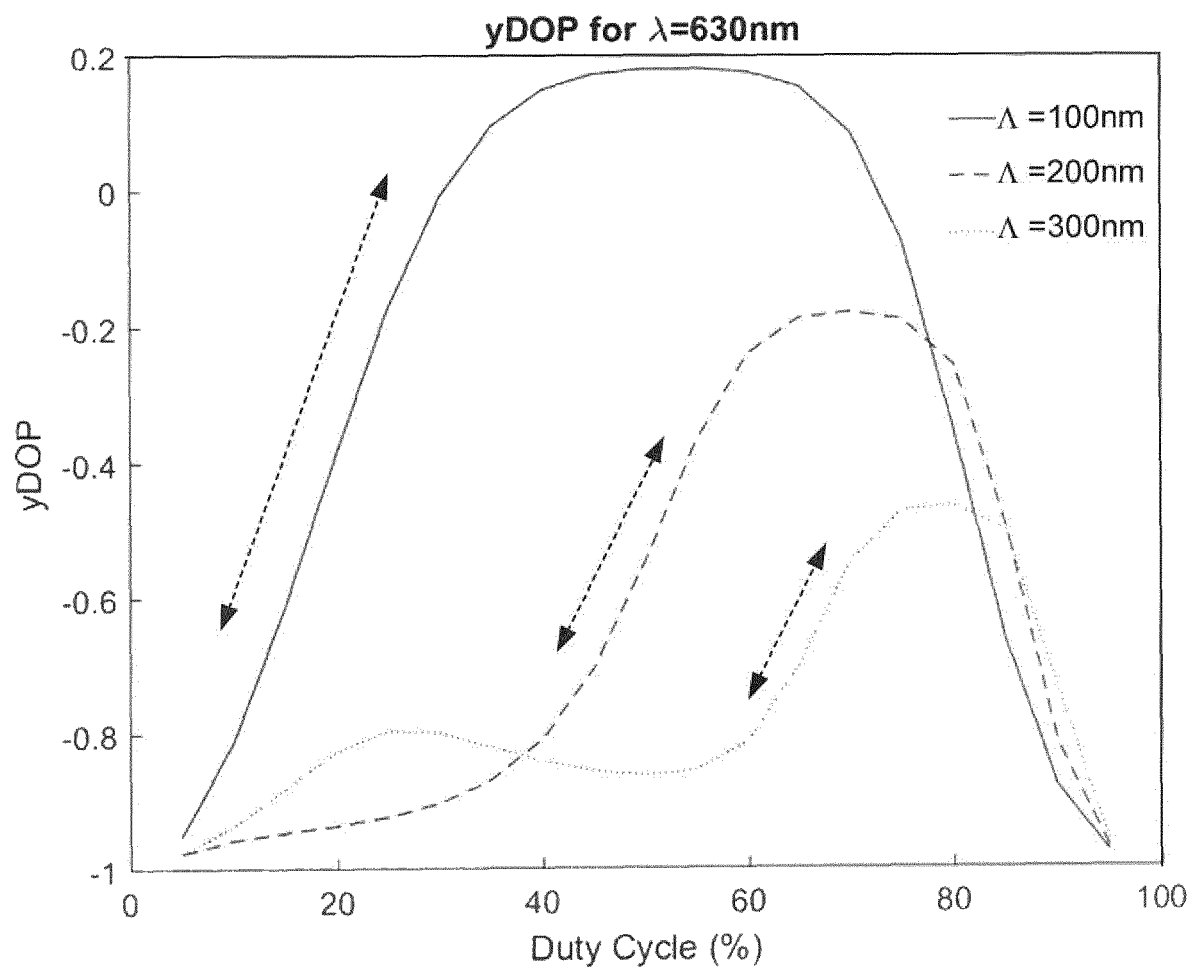
FIG. 8 illustrates y-projected degree of polarization as a function of duty cycle for an alignment target, according to some embodiments.

FIG. 8 illustrates simulated y-projected degree of polarization yDOP as a function of duty cycle F of alignment target 678 shown in FIGS. 7A and 7B, according to some embodiments. The wavelength λ of illumination beam 674 at incidence can be, e.g., 630 nm. The plotted lines correspond to a pitch Λ of 100 nm, 200 nm or 300 nm. Along the arrow of each function, the relationship between yDOP and duty cycle can be monotonic, and the dependence of yDOP on duty cycle can be very sensitive.

Designing alignment target 678 with duty cycle in the corresponding range can provide sensitive alignment information. For example, a measured yDOP can be projected on the plotted lines in FIG. 8 and a corresponding duty cycle can be determined for a known pitch. From the physical location of the corresponding duty cycle on alignment target 678, alignment position of alignment system 650 can be adjusted with respect to alignment axis 421.

Figure 9:
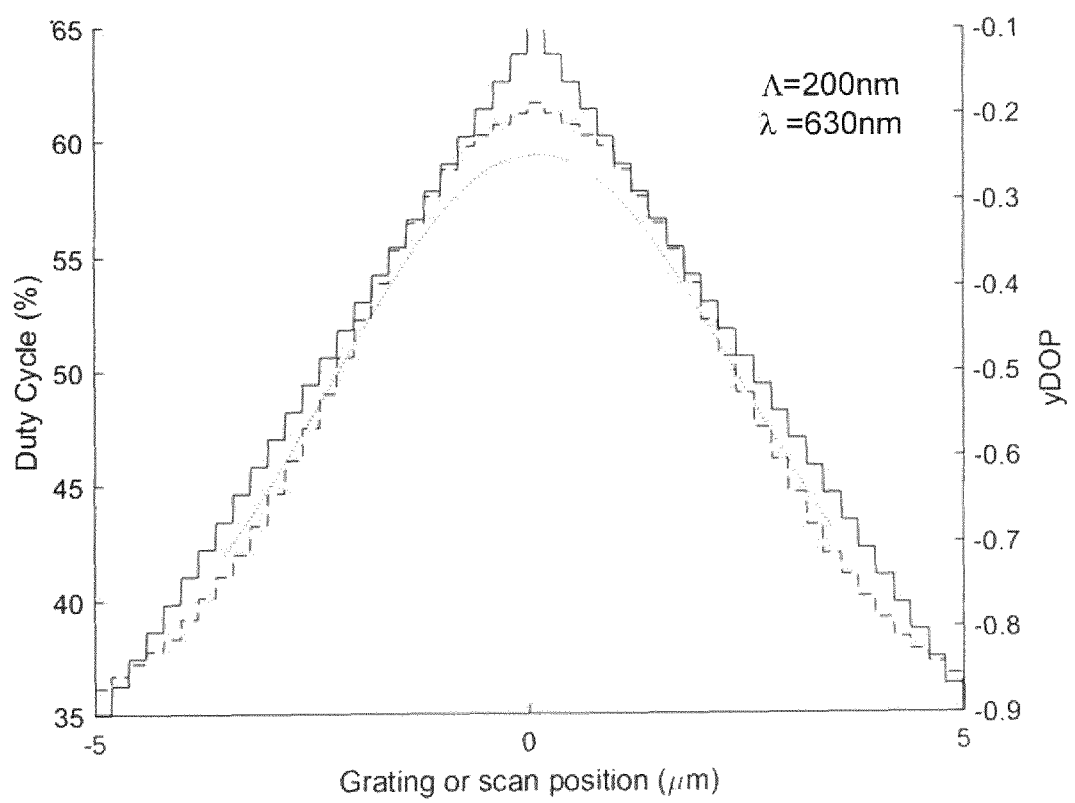
FIG. 9 illustrates an exemplary design of duty cycle of an alignment target, according to some embodiments.

FIG. 9 illustrates a simulated result of another example of alignment target 678, according to some embodiment. For example, alignment target 678 can be designed with a plurality of sub-wavelength gratings with period A=200 nm for an illumination beam 674 at 630 nm wavelength. In one example, the sub-wavelength gratings having a single pitch with duty cycles increasing from 35% to 65% and then decreasing to 35%. In one example, duty cycle of the alignment target is a function of grating position shown as the solid line in FIG. 9.

In one example, the diffraction property of the alignment target 678 is simulated using RCWA approach. In this example, the fixed period and the varying duty cycle as described above are used. Simulated y-projected degree of polarizations (yDOPs) are plotted as a dotted line and a dash line in FIG. 9 for an illumination beam of tophap shape with a spot diameter of 3 μm and for a point illumination with spot size <<grating width, respectively. Once a yDOP is measured from this alignment target in alignment system 650, measured yDOP can be projected in FIG. 9 to extract a corresponding grating position on the alignment target. As more layers are printed on top of the mark layer, the alignment system can repeatedly measure this mark and determine this peak position as a stable reference.

In FIGS. 7-9, the shape of the sub-wavelength gratings designed for alignment target 678 are rectangular. In some embodiments, the sub-wavelength gratings can have an asymmetric shape with a top tilt, a bottom tilt or a sidewall angle. RCWA simulation can also show that shape asymmetry of the sub-wavelength grating does not affect the magnitude of form birefringence, and thereby does not affect the y-projected degree of polarization. Therefore, alignment scheme based on form birefringence of sub-wavelength gratings can provide reliable alignment method, independent of structure changes in the alignment target due to process variations experienced by substrate 680. The structure of the sub-wavelength grating is not limited to the shapes described above. In some embodiments, the sub-wavelength grating can have a sinusoidal shape, or any other shape, that can produce sufficient form birefringence effect.

Alignment system 650 can be built as a part of lithographic apparatus 100 or 100'. Alignment system 650 can also be used together with other alignment systems to provide calibration or failure analysis due to process induced asymmetric in the alignment target.

Exemplary Flow Diagram

Figure 10:
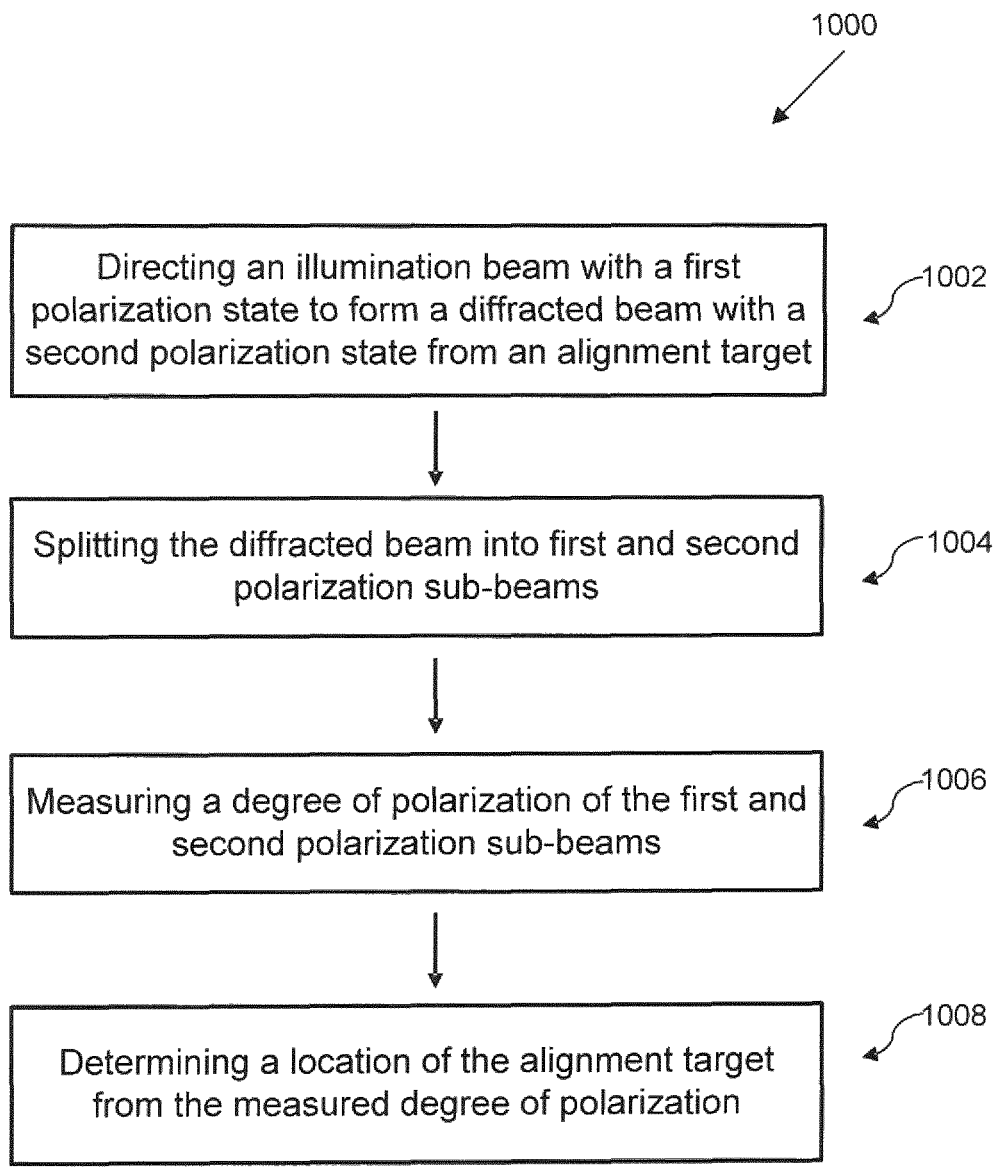
FIG. 10 illustrates a flow diagram for measuring alignment position, according to an exemplary embodiment.

FIG. 10 illustrates flow diagram 1000 for determining a location of an alignment target, according to an embodiment. It is to be appreciated that not all steps in FIG. 10 may be needed to perform the disclosure provided herein. Further, some of the steps may be performed simultaneously, or in a different order than shown in FIG. 10. Flow diagram 1000 shall be described with reference to FIG. 6. However, flow diagram 1000 is not limited to those example embodiments.

In step 1002, as shown in the example of FIG. 6, illumination beam 674 with a first polarization state propagates along an illumination path toward beam splitter 664. Beam splitter 664 may direct illumination beam 674 toward objective lens 654, which focuses illumination beam 674 on alignment target 678 on substrate 680. Diffracted beam 676 with a second polarization state can be reflected from alignment target 678 and collected by objective lens 654. Beam splitter 664 may transmit diffracted beam 676 to polarizing beam splitter 666.

In step 1004, beam analyzer or polarizing beam splitter 666 splits diffracted beam 676 into orthogonal polarization components (i.e., first and second polarization sub-beams 690/692). Polarizing beam splitter 666 reflects s-polarized sub-beams 690 along "X" direction and transmits p-polarized sub-beams 692 along "Z" direction.

In step 1006, as shown in the example of FIG. 6, light intensity of first and second polarization sub-beams 690/692 can be measured at first and second detectors 668/670. A y-projected degree of polarization can be characterized using the measured values of first and second polarization sub-beams 690/692.

In step 1008, processor 672 can be used to compare the measured y-projected degree of polarization with simulated result from Rigorous Coupled-Wave Analysis (RCWA) to determine the physical parameters of alignment target 678. In some embodiments, alignment target 678 includes sub-wavelength gratings with a single pitch and a variation of duty cycle. In one example, the duty cycle can follow a linear function with respect to the grating position. Therefore, from the measured y-projected degree of polarization, corresponding duty cycle can be extrapolated from RCWA simulation and thereby the location of the alignment target can be determined from the physical position of the grating with the corresponding duty cycle. In some embodiments, a simple curve fitting routine can be implemented without requiring electromagnetic simulations.

The embodiments may further be described using the following clauses:

1. A method comprising:
   directing an illumination beam with a first polarization state to form a diffracted beam with a second polarization state from an alignment target;
   splitting the diffracted beam into first and second polarization sub-beams;
   measuring a polarization state of the first and second polarization sub-beams; and
   determining a location of the alignment target from the measured polarization state.
2. The method of clause 1, wherein:
   the alignment target comprises a plurality of diffraction grating periods with a single pitch and two or more duty cycles;
   the pitch is smaller than a wavelength of the illumination beam; and
   the location of the alignment target corresponds to the duty cycle of the diffraction grating.
3. The method of clause 2, wherein the diffraction gratings comprise a rectangular shape.
4. The method of clause 2, wherein the diffraction gratings comprise asymmetric shapes with a top-tilt, a bottom tilt or a sidewall angle.
5. The method of clause 2, wherein the diffraction gratings comprise a sinusoidal shape.
6. The method of clause 2, wherein:
   the illumination beam is linearly polarized; and
   an electric field of the illumination beam forms an angle between 0 degree and 90 degree with respect to grating lines.
7. The method of clause 1, wherein the illumination beam is circularly or elliptically polarized.
8. A system, comprising:
   first and second optical systems, wherein:
   the first optical system is configured to direct an illumination beam with a first polarization state towards an alignment target and direct a diffracted beam with a second polarization state from the alignment target to the second optical system; and
   the second optical system is configured to split the diffracted beam into first and second polarization sub-beams;
   first and second detectors configured to measure a polarization state from the first and second polarization sub-beams; and
   a processor configured to determine a location of the alignment target from the measured polarization state.
9. The system of clause 8, wherein the first and second optical systems are monolithically integrated together on a photonics circuit and coupled to the alignment target on the substrate.
10. The system of clause 9, wherein:
    the substrate comprises silicon; and
    the first and second optical systems comprise silicon photonics.
11. The system of clause 8, wherein the first and second detectors are monolithically integrated to filters and beam shaping optics in an integrated photonics package.
12. The system of clause 8, further comprising optical links using fiber optics for the first and second optical systems.
13. The system of clause 8, wherein the alignment target comprises a plurality of diffraction gratings with a single pitch and two or more duty cycles, the pitch being smaller than a wavelength of the illumination beam.
14. The system of clause 13, wherein the diffraction grating comprises a rectangular shape.
15. The alignment system of clause 13, wherein the diffraction gratings comprise asymmetric shapes with a top tilt, a bottom tilt or a sidewall angle.
16. The alignment system of clause 13, wherein the diffraction gratings comprise a sinusoidal shape.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some embodiments, the substrate itself may be patterned and materials added on top of it may also be patterned, or may remain without patterning.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other forms of propagated signals, and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, and/or instructions.

The following examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

Although specific reference may be made in this text to the use of the apparatus and/or system according to the invention in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

The invention claimed is:

1. A method comprising:
   directing an illumination beam with a first polarization state to form a zeroth order diffracted beam with a second polarization state from an alignment target;
   splitting the diffracted beam into first and second polarization sub-beams in a non-interfering manner;
   measuring a polarization state of the first and second polarization sub-beams; and
   determining a location of the alignment target from the measured polarization state.

2. The method of claim 1, wherein:
   the alignment target comprises a plurality of diffraction grating periods with a single pitch and two or more duty cycles;
   the pitch is smaller than a wavelength of the illumination beam; and
   the location of the alignment target corresponds to a duty cycle of a diffraction grating of the plurality of diffraction gratings.

3. The method of claim 2, wherein the diffraction gratings comprise a rectangular shape.

4. The method of claim 2, wherein the diffraction gratings comprise asymmetric shapes with a top-tilt, a bottom tilt or a sidewall angle.

5. The method of claim 2, wherein the diffraction gratings comprise a sinusoidal shape.

6. The method of claim 2, wherein:
   the illumination beam is linearly polarized; and
   an electric field of the illumination beam forms an angle between 0 degrees and 90 degrees with respect to grating lines.

7. The method of claim 1, wherein the illumination beam is circularly or elliptically polarized.

8. A system, comprising:
   first and second optical systems, wherein:
      the first optical system is non-interfering and configured to direct an illumination beam with a first polarization state towards an alignment target and direct a diffracted beam including a zeroth order with a second polarization state from the alignment target to the second optical system; and
      the second optical system is configured to split the diffracted beam into first and second polarization sub-beams;
   first and second detectors configured to measure a polarization state from the first and second polarization sub-beams; and
   a processor configured to determine a location of the alignment target from the measured polarization state.

9. The system of claim 8, wherein the first and second optical systems are monolithically integrated together on a photonics circuit and coupled to the alignment target on a substrate.

10. The system of claim 9, wherein:
    the substrate comprises silicon; and
    the first and second optical systems comprise silicon photonics.

11. The system of claim 8, wherein the first and second detectors are monolithically integrated to filters and beam shaping optics in an integrated photonics package.

12. The system of claim 8, further comprising optical links using fiber optics for the first and second optical systems.

13. The system of claim 8, wherein the alignment target comprises a plurality of diffraction gratings with a single pitch and two or more duty cycles, the pitch being smaller than a wavelength of the illumination beam.

14. The system of claim 13, wherein the diffraction grating comprise a rectangular shape.

15. The alignment system of claim 13, wherein the diffraction gratings comprise asymmetric shapes with a top tilt, a bottom tilt or a sidewall angle.

16. The alignment system of claim 13, wherein the diffraction gratings comprise a sinusoidal shape.

* * * * *

UNITED STATES PATENT AND TRADEMARK OFFICE
CERTIFICATE OF CORRECTION

| | |
|---|---|
| PATENT NO. | : 11,971,665 B2 |
| APPLICATION NO. | : 17/432019 |
| DATED | : April 30, 2024 |
| INVENTOR(S) | : Adams et al. |

It is certified that error appears in the above-identified patent and that said Letters Patent is hereby corrected as shown below:

In the Claims

In Column 28, Claim 2, Line 31, delete "grating periods" and insert -- gratings --, therefor.

In Column 29, Claim 14, Line 20, delete "grating" and insert -- gratings --, therefor.

Signed and Sealed this
Eighteenth Day of June, 2024

Katherine Kelly Vidal
*Director of the United States Patent and Trademark Office*